United States Patent [19]

Ehrreich

[11] 4,435,214

[45] Mar. 6, 1984

[54] CONDUCTIVE COMPOSITIONS

[75] Inventor: John E. Ehrreich, Wayland, Mass.

[73] Assignee: Ercon, Inc., Waltham, Mass.

[21] Appl. No.: 501,602

[22] Filed: Jun. 6, 1983

Related U.S. Application Data

[60] Continuation-in-part of Ser. No. 308,242, Oct. 2, 1981, Pat. No. 4,407,674, which is a division of Ser. No. 126,681, Mar. 3, 1981, Pat. No. 4,319,920.

[51] Int. Cl.³ .............................. B22F 1/00; B22F 1/02
[52] U.S. Cl. ..................................... 75/251; 106/1.19
[58] Field of Search .............................. 75/251, 0.5 A; 106/1.19

[56] References Cited

U.S. PATENT DOCUMENTS

| | | | |
|---|---|---|---|
| 3,725,035 | 4/1973 | Short et al. | 75/0.5 A |
| 3,725,036 | 4/1973 | Ehrreich et al. | 75/0.5 A |
| 3,725,047 | 4/1973 | Schneider | 75/118 R |
| 3,816,097 | 6/1974 | Daiga | 75/0.5 A |
| 3,856,507 | 12/1974 | Brug et al. | 75/0.5 A |
| 4,319,920 | 3/1982 | Ehrreich | 75/0.5 A |

Primary Examiner—W. Stallard
Attorney, Agent, or Firm—Andrew F. Kehoe

[57] ABSTRACT

Improved compositions of the type using metal flake in resin binders. The distribution of the flakes can be much enhanced using relatively small quantities of an ultra-thin, non-planar metal flake. Enhanced electroconductivity is a particular advantage of the invention.

12 Claims, 2 Drawing Figures

CONDUCTIVE COMPOSITIONS

RELATED APPLICATION

This application is a continuation-in-part of U.S. patent application Ser. No. 308,242 filed on Oct. 2, 1981, now U.S. Pat. No. 4,407,674 which is a division of a co-pending and commonly-owned application of John E. Ehrreich Ser. No. 126,681 filed on Mar. 3, 1981 and now issued as U.S. Pat. No. 4,319,920.

BACKGROUND OF THE INVENTION

This invention relates to the manufacture of improved compositions of the type comprising flake-shaped additives dispersed in binders, usually organic resin and polymer binders, to achieve a flake-related advantage such as an improvement in electroconductivity.

The prior art has generally recognized the fact that conductivity is best imparted to organic resin compositions by utilizing flake forms of conductor particles in the composition. Moreover, there have been a number of procedures discovered for improving the efficiency of conductive flake—usually silver flake—in the compositions. Some such work has described the use of limited amounts of non-flake, non-conductive, powders to minimize the flake particles from lining up in parallel relationship one to the other. Such parallel relationship is known to limit the probability of adjacent flakes making the desired contact. Silica particles have been used for such a purpose.

Also, another type of silica particles, the ultra-fine pyrogenic silica sold under the trademark Cab-O-Sil by Cabot Corporation has, been utilized in a great number of materials from calamine lotion to conductive, resin-based liquid systems to retard the settling of suspended solids. This silica material, also non-conductive, works in a number of ways, depending upon the particular system, but in general works to thicken the liquid phase through hydrogen bonding or some other such mechanism. The objective of such work was to overcome the detrimental tendency for metal flakes to settle out of lower viscosity systems such as solvent-based inks and paints. Settling results in non uniformity application and consequent erratic conductivity values.

In general, it has been desirable to provide such conductive compositions that are improved in terms of conductivity and settling characteristics and to do it without the necessity of adding non-conductive diluent particles to the composition.

SUMMARY OF THE INVENTION

Therefore it is a principal object of the invention to improve the properties of conductive-flake-bearing liquid resin compositions, especially compositions of the type comprising a major portion of conventional mechanically-formed flakes.

Another object of the invention is to provide improved solid compositions including dry or cured solid coatings, of the type formed from conductive-flake-bearing liquid resin compositions.

Still another object of the invention is to provide means to utilize relatively high quantities of conventional metal flake in compositions which are resistant to settling and which exhibit much improved particle-to-particle electroconductive contact.

A more specific object of the invention is to formulate improved long-term curing compositions, particularly so-called room-temperature curing epoxy resin systems and the like.

Other objects of the invention will be obvious to those skilled in the art on their reading of this disclosure.

The above objects have been substantially achieved by the discovery that certain ultra-thin, non-planar, chemically-precipitated silver flakes of low bulk density can be used in minor quantities to synergistically enhance the physical and processing properties of organic polymer and resin binder systems using a major portion of more conventional mechanically prepared conductive metal flakes.

As used herein, "major" relates to 50% by metal volume or more and "minor" to 50% by metal volume or less. The terms are always used to denote the metal volume of conductive flake particles which are then incorporated into a binder system for manufacture of conductive sheets, coatings, gaskets, electrical encapsulation compounds or the like. If silver, all of these flakes will usually comprise from about 55 to 85% by weight of the composition in which they are continued. However, whenever metal is substituted by a less dense material, as in silver-coated glass for example, then the weight percent must be adjusted accordingly. The novel flakes which are of particular interest are nobel metal precipitated flakes, particularly silver flakes characterized by an average thickness of less than about 0.2 micron thickness and a low bulk density, preferably less than about 0.5 gram per cc and usually between 0.15 and 0.85 grams per cc. The flakes are described in U.S. Pat. No. 4,139,920 to Ehrreich which is incorporated herein by reference. The flakes are now commercially available from Metz Metallurgical Corporation of South Plainfield, N.J. These flakes are called "Ehrreich flakes".

Thus, in such systems, the irregularity of the flake shape and its extreme thinness characteristics which help give it its low bulk density, help to promote particle-to-particle contact with adjacent flakes, and also slows the flake settling rate within the system. These characteristics also provide a measure of viscosity control allowing tailoring of systems to have those rheological properties most suitable for any selected made of operation.

It has been found that the thin, non-planar flakes of the Ehrreich type serve, most surprisingly at levels as low as from 5 to 30 percent by weight of the total conductive flake, but most often at levels of from 20 to 50 percent by weight, to allow users of such systems to improve their systems; because, for a given amount of flake, higher viscosity, less settling, and better flake-to-flake electrical contact can be achieved through the cure period.

For the purposes of the application, these flakes will be called the Ehrreich flake and will be illustrated with reference to a flake made according to Example 4 of U.S. Pat. No. 4,139,920. This flake had an apparent density of 0.27 grams per cc. In general, flakes of below about 0.5 grams per cc are preferred in forming the blends described herein.

Minor amounts of these Ehrreich flakes when combined with other conductive flake provides a versatile formulating tool whereby major advantages in rheology, and higher conductivity can be achieved.

A good example of the advantages achievable with such flake combinations is in the field of room temperatures curing. Such low temperatures curing, say of epoxy resin systems, may be merely economic or convenient. Often it is necessary, because the epoxy system is used in conjunction with electronic components which are temperature sensitive. There has been a tendency during the inherently longer-term low-temperature curing of such systems for the epoxy resin to form insulating layers between the flake and for the flake to settle out. Use of flake blends according to the present invention greatly reduce the loss in electroconductivity formed by this undesirable phenomena.

ILLUSTRATIVE EXAMPLE OF THE INVENTION

In order to point out more fully the nature of the present invention, the following specific examples are given as illustrative embodiments of the present process and products produced thereby.

Figure 1:
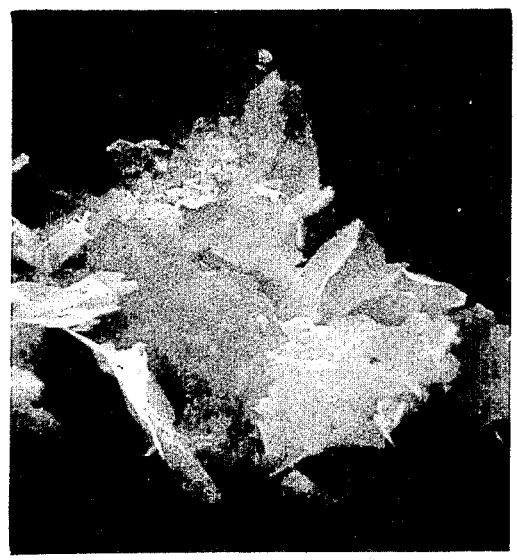
FIG. 1 illustrates an agglomeration of Ehrreich flakes in (10,000× from a scanning electron microscope or "SEM"). The agglomeration may break up to some extent on compounding.

As indicated in FIG. 1, the precipitated Ehrreich flakes comprise a plurality of fold-backs and multiple-layer components. Not seen so clearly is a tendency to arc shape portions of the surface. In any event the flake is primarily characterized a very low bulk density.

Figure 2:
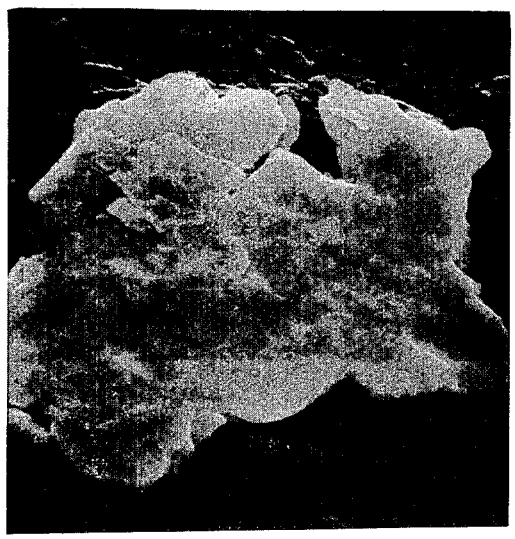
FIG. 2 illustrates a typical mechanically-milled flake (7,000× from a SEM).

FIG. 2 shows the "hammered-flat" appearance typical of ball-milled metal flakes.

EXAMPLE 1

(Comparative Example)

An epoxy resin mixture is formed of a mixture of 88 grams of a bisphenol A/epichlorohydrin-based epoxy resin sold by Shell Chemical under the trademark Epon 828 and 12 grams of butyl glycidyl either sold under the trade designation RD-1 by Ciba Co.

A quantity of 100 grams of this epoxy was mixed with 150 grams of a conventional commercial silver flake (Metz No. 16) to for a composition 60 percent by weight of silver. Twenty grams of this silver-bearing composition was mixed with 1.12 grams of triethylenetetramine (TETA) curing agent to form a conductive coating composition which was applied, 0.005-inch thick, to a glass plate.

After being cured at room temperature for 28 hours at 70° F., the volume resistivity of the coating was 0.25 ohm-cm. When another sample of the same coating compositions was cured at 150° F. for 2 hours, it had a volume resistivity of 11.5 ohm-cm.

EXAMPLE 2

A quantity of 100 grams of the epoxy resin mixture of Example 1 was mixed with 85.7 grams of the conventional silver flake and 28.6 of the silver flake described in Example 4 of U.S. Pat. No. 4,319,920.

Total silver content of the resultant compositions was 53.4 weight percent. Twenty grams of the composition was mixed with 1.29 grams of TETA.

On coating and curing for 28 hours at 70° F., the volume resistivity was 0.0455 ohm-cm; i.e. there was a 550% increase in conductivity over the Example 1 control.

On curing at 150° for two hours, the volume resistivity was 0.014 ohm-cm indicating an increase of more than 800 times in conductivity.

EXAMPLE 3

A quantity of 100 grams of epoxy compositions of Example 1 was mixed with 85.7 of the conventional flake (Metz No. 16) and 46.4 grams of the Ehrreich flake. The composition contained 56.9 percent by weight of silver.

A quantity of 1.16 grams TETA was mixed into 20 grams of the mixture.

Room temperature cure, as carried out in Example 1, resulted in a 0.0224 ohm-cm resistivity indicative of an increase in conductivity of 11 times over that of the control of Example 1.

The 2 hour cure at 150° F. was also carried out with the composition. The resistivity of 0.0078 ohm-cm indicated a conductivity 1,474 times the conductivity of the control of Example 1.

EXAMPLE 4

(Comparative Example)

A quantity of 120 grams Rohm and Haas Acryloid B-44 (Methyl Methocrylate Copolymer) was dissolved in 480 grams of cellosolve acetate to form an acrylic resin paste.

Twenty grams of the mixture was mixed with 16 grams of a nickel flake sold by Novomat division of MPD Corp. as HCA-1. When the resultant composition was coated on a glass plate, at 5 mil wet thickness, and dried for an hour at 176° F., the surface resistivity was measured at 138 ohms per square.

EXAMPLE 5

Example 4 was repeated except that 3 grams of the HCA-1 flake was replaced with the Ehrreich flake. As in example four the wet coating composition was 44.4 weight percent metal flake.

The surface resistivity dropped from the 138 ohms per square of Example 4 to 30 ohms per square indicating a better than four-fold increase in conductivity.

EXAMPLE 6

(Comparative Example)

Example 4 was repeated using 16 grams of a post-treated nickel flake available under the trade designation Cobaloy 830 from Graham Magnetics. Drying was at about 70°–75° for 72 hours with the 5-mil coating on a vertical glass surface. There was a tendency for the coating to run in this binder system and average surface resistance was 8.8 ohms per square.

EXAMPLE 7

When only 0.9 grams of Ehrreich flake was added to 16.3 grams of the wet coating of Example 6, the coating was more uniform and resistance was reduced to 3.5 ohms per square when the indicated vertical of Example 6 was repeated.

EXAMPLE 8

To a quantity of 100 grams of the epoxy binder system of Example 1 was mixed with 51.9 grams of a conventional, mechanically-milled, silver flake (Metz No. 7) and 51.9 grams of Ehrreich silver flake. The system contained 50.9 weight percent of silver by weight.

A quality of 20 grams of this composition was cured with 1.4 grams TETA. A 5-mil wet coating on glass was cured for 28 hours at 70° F. The volume resistivity was 0.0169 ohm-cm. Thus almost 15 times the conductivity was achieved as was achieved with a similar cure for the control of Example 1 even though the total silver was reduced from 60% to 51%.

The HCA-1 nickel flake sold by Novamet division of MPD Tech Corp. has an average flake thickness of 1.2 microns, a bulk volume of 0.033 gallons per pound and on apparent bulk density of about 1.3 grams per cubic centimeter. It is said to have an average flake thickness of 1.2 microns and an average aspect ratio of average diameter to thickness of 33:1. It appears to be a mechanically-formed (e.g. ball milled or the like) flake product.

Cobaloy nickel flake is believed to be a post-treated, oxidation-resistant, proprietary nickel flake product available from Graham Magnetics Incorporated of North Richland Hills, Tex.

Typical values of the Metz No. 16 silver flake include TAP density (by Tap-PAK method) of about 2.7 grams per cubic centimeter. Its Fisher Sub Sieve Size is 0.85 microns and it all passes a 200 mesh sieve. The flake is available from Metz Metallurgical Corp of South Plainfield, N.J. All of these flakes are promoted for their value in forming low-resistivity electrically conductive coating and adhesives.

It is also to be understood that the following claims are intended to cover all of the generic and specific features of the invention herein described and all statements of the scope of the invention which might be said to fall therebetween.

What is claimed is:

1. A metal powder product formed of (A) up to 50% by volume of a precipitated non-planar, essentially flake-shaped particles wherein silver particles are characterized by an average thickness of less than about 0.2 microns and characterized by a bulk density up to 0.85 gram per cc and (B) at least 50% by volume of a relatively-planar, mechanically-formed, conductive flake powder of at least about 1 gram per cc in bulk density.

2. A metal powder product as defined in claim 1 wherein said bulk density of said non-planar flake about has a maximum bulk density of about 0.5 grams per cc and wherein said mechanically formed conductive flake powder has a bulk density of at least about 1.2 grams per cc.

3. A metal powder product as defined in claim 2 wherein said non-planar flake has comprises less than 5 to 30 percent of all said metal powders.

4. A processable composition of matter comprising (A) a silver-powder product of claim 1 and (B) a solidifiable liquid vehicle formed of an organic resin and convertible into a solid binder for maintaining said particles in particle-to-particle contact.

5. A composition of matter as defined in claim 4 wherein said liquid is a liquid thermosetting resin system curable at ambient temperature below 100° F. within forty-eight hours of cure time.

6. A composition of matter as defined in claim 4 wherein said liquid is an thermoplastic resin system in a solvent vehicle.

7. A processable composition of matter comprising (A) a silver powder product of claim 2 and (B) a solidifiable liquid vehicle formed of an organic resin and convertible into a solid binder for maintaining said particles in particle-to-particle contact.

8. A composition of matter as defined in claim 7 wherein said liquid is an epoxy-resin system curable at ambient temperature below 100° F. within forty-eight hours of cure time.

9. A composition of matter as defined in claim 7 wherein said liquid is an acrylic resin system.

10. A composition as defined in claim 4 wherein said powder is silver and is present at loadings below 65 percent by weight of said compositions.

11. A composition as defined in claim 2 wherein said powder is silver and is present at loadings below 65 percent by weight of said compositions.

12. A composition as defined in claim 3 wherein said powder is silver and is present at loadings below 65 percent by weight of said compositions.

* * * * *

UNITED STATES PATENT AND TRADEMARK OFFICE
CERTIFICATE OF CORRECTION

PATENT NO. : 4,435,214
DATED : March 6, 1984
INVENTOR(S) : John E. Ehrreich

It is certified that error appears in the above-identified patent and that said Letters Patent are hereby corrected as shown below:

Column 2, line 45   change "made" to --mode--;

Column 3, line 44   change "for" to --form--;

Column 6, line 8   delete "has";

Column 6, line 20   change "an" to --a--.

Signed and Sealed this

Nineteenth Day of June 1984

[SEAL]

Attest:

Attesting Officer

GERALD J. MOSSINGHOFF
Commissioner of Patents and Trademarks